(12) United States Patent
Long

(10) Patent No.: US 11,289,678 B2
(45) Date of Patent: Mar. 29, 2022

(54) DISPLAY SUBSTRATE, FABRICATION METHOD THEREOF AND DISPLAY PANEL

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 16/614,140

(22) PCT Filed: Jun. 13, 2019

(86) PCT No.: PCT/CN2019/091127
§ 371 (c)(1),
(2) Date: Nov. 15, 2019

(87) PCT Pub. No.: WO2020/024705
PCT Pub. Date: Feb. 6, 2020

(65) Prior Publication Data
US 2021/0336212 A1  Oct. 28, 2021

(30) Foreign Application Priority Data
Aug. 1, 2018 (CN) .......................... 201810862548.5

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 27/3258* (2013.01); *H01L 51/56* (2013.01); *H01L 2227/323* (2013.01)

(58) Field of Classification Search
CPC ............. H01L 27/3246; H01L 27/3258; H01L 2227/323; H01L 51/5253–5256
See application file for complete search history.

(56) References Cited

U.S. PATENT DOCUMENTS

2015/0380685 A1* 12/2015 Lee ...................... H01L 51/5237
                                                            257/40
2016/0268355 A1*  9/2016 Shi ...................... H01L 27/3246
(Continued)

FOREIGN PATENT DOCUMENTS

CN  101908599 A   12/2010
CN  104900681 A    9/2015
(Continued)

OTHER PUBLICATIONS

Second Office Action dated Jun. 2, 2021 for application No. KR10-2019-7035932 with English translation attached.
(Continued)

*Primary Examiner* — Shaun M Campbell
(74) *Attorney, Agent, or Firm* — Nath, Goldberg & Meyer; Joshua B. Goldberg

(57) ABSTRACT

The present disclosure provides a display substrate, a fabrication method thereof and a display panel. The display substrate includes a display area (101) and a non-display area (102) around the display area (101), the display substrate further includes: a base substrate (100); at least one barrier dam (200) and a first encapsulating layer (310) on the base substrate (100), the barrier dam (200) is in the non-display area (102) on the base substrate (100), the first encapsulating layer (310) is on the base substrate (100) and on a side of the at least one barrier dam (200) facing the display area (101), the first encapsulating layer (310) is formed by a first encapsulating material (301) in a cured state, and at least a side of the barrier dam (200) facing the first encapsulating layer (310) is lyophobic with respect to the first encapsulating material (301) in a non-cured state.

15 Claims, 8 Drawing Sheets

(56) References Cited

U.S. PATENT DOCUMENTS

| | | | |
|---|---|---|---|
| 2017/0149017 A1* | 5/2017 | Lee | H01L 27/3246 |
| 2017/0155082 A1* | 6/2017 | Mu | H01L 51/5293 |
| 2018/0013096 A1 | 1/2018 | Hamada et al. | |
| 2018/0090544 A1 | 3/2018 | Gunji | |
| 2018/0108867 A1* | 4/2018 | Lee | H01L 27/3262 |
| 2018/0151838 A1* | 5/2018 | Park | H01L 27/3258 |
| 2019/0148469 A1* | 5/2019 | Lhee | H01L 27/3258 |
| | | | 257/40 |
| 2019/0312226 A1* | 10/2019 | Huang | H01L 51/5256 |
| 2019/0355929 A1* | 11/2019 | Xu | H01L 51/5256 |

FOREIGN PATENT DOCUMENTS

| | | |
|---|---|---|
| CN | 105914224 A | 8/2016 |
| CN | 106953029 A | 7/2017 |
| CN | 107507931 A | 12/2017 |
| CN | 206893618 U | 1/2018 |
| CN | 107968111 A | 4/2018 |
| CN | 109037289 A | 12/2018 |
| JP | 2011018632 A | 1/2011 |
| KR | 20180054386 A | 5/2018 |
| WO | 2012017495 A1 | 2/2012 |

OTHER PUBLICATIONS

First Office Action dated Oct. 21, 2019 corresponding to Chinese application No. 201810862548.5.
First Office Action dated Oct. 28, 2020 for application No. KR 10-2019-7035932 with English translation attached.
Office Action dated Jul. 20, 2021 issued in corresponding Indian Application No. 201927051606.

* cited by examiner

US 11,289,678 B2

DISPLAY SUBSTRATE, FABRICATION METHOD THEREOF AND DISPLAY PANEL

This is a National Phase Application filed under 35 U.S.C. 371 as a national stage of PCT/CN2019/091127, filed on Jun. 13, 2019, an application claiming the benefit of priority to Chinese Patent Application No. 201810862548.5, filed on Aug. 1, 2018, the contents of which are incorporated herein in their entirety by reference.

TECHNICAL FIELD

At least one embodiment of the present disclosure relates to a display substrate, a fabrication method thereof and a display panel.

BACKGROUND

An Organic Light-Emitting Diode (OLED) is an organic thin film electroluminescent device, and has received great attention due to its advantages of simple fabricating process, low cost, low power consumption, high brightness, wide viewing angle, high contrast, and flexible display.

The OLED electronic display product needs to be encapsulated to prevent the internal components from being aged and damaged due to the influence of moisture, oxygen and the like penetrating into the OLED electronic display product. However, the current OLED electronic display product is limited by its design structure, so the yield of the encapsulation cannot be further improved.

SUMMARY

At least one embodiment of the present disclosure provides a display substrate including a display area and a non-display area around the display area, the display substrate further includes: a base substrate; a barrier dam and a first encapsulating layer on the base substrate, the barrier dam is in the non-display area on the base substrate, the first encapsulating layer is on the base substrate and on a side of the barrier dam facing the display area, the first encapsulating layer is formed by a first encapsulating material in a cured state, and at least a side of the barrier dam facing the first encapsulating layer is lyophobic with respect to the first encapsulating material in a non-cured state.

For example, in the display substrate in at least one embodiment of the present disclosure, a planar shape of the barrier dam is a closed loop surrounding the display area.

For example, in the display substrate in at least one embodiment of the present disclosure, the display substrate includes a plurality of barrier dams, and the plurality of barrier dams are spaced apart from each other.

For example, in the display substrate in at least one embodiment of the present disclosure, the plurality of barrier dams include a first barrier dam and a second barrier dam, the first barrier dam is between the second barrier dam and the display area, and a distance from a surface of the first barrier dam away from the base substrate to a surface of the base substrate facing the plurality of barrier dams is smaller than a distance from a surface of the second barrier dam away from the base substrate to the surface of the base substrate facing the plurality of barrier dams.

For example, in the display substrate in at least one embodiment of the present disclosure, the plurality of barrier dams further include a third barrier dam on a side of the second barrier dam away from the first barrier dam, and the distance from the surface of the second barrier dam away from the base substrate to the surface of the base substrate facing the plurality of barrier dams is smaller than a distance from a surface of the third barrier dam away from the base substrate to the surface of the base substrate facing the plurality of barrier dams.

For example, in the display substrate in at least one embodiment of the present disclosure, a distance from a surface of the first encapsulating layer away from the base substrate to a surface of the base substrate facing the first encapsulating layer is greater than a distance from a surface of the barrier dam away from the base substrate to the surface of the base substrate facing the first encapsulating layer.

For example, the display substrate in at least one embodiment of the present disclosure further includes a pixel defining layer on the base substrate, and the pixel defining layer is between the base substrate and the first encapsulating layer.

For example, in the display substrate in at least one embodiment of the present disclosure, the pixel defining layer has a single-layer structure, and the barrier dam includes a first barrier layer that is in the same layer and made of the same material as the pixel defining layer.

For example, in the display substrate in at least one embodiment of the present disclosure, the pixel defining layer has a single-layer structure, the barrier dam includes a first barrier layer and a photoresist layer stacked on each other, the first barrier layer is between the base substrate and the photoresist layer, and the first barrier layer and the pixel defining layer are in a same layer and made of a same material.

For example, in the display substrate in at least one embodiment of the present disclosure, the pixel defining layer includes a first defining layer and a second defining layer stacked on each other, the first defining layer is between the second defining layer and the base substrate; and the barrier dam includes a first barrier layer and a second barrier layer, the first barrier layer and the first defining layer are in a same layer and made of a same material, and the second barrier layer and the second defining layer are in a same layer and made of a same material.

For example, in the display substrate in at least one embodiment of the present disclosure, the barrier dam further includes at least one photoresist layer on a side of the first barrier layer or the second barrier layer away from the base substrate.

For example, in the display substrate in at least one embodiment of the present disclosure, a material of the pixel defining layer includes at least one of polymethyl methacrylate, polyimide, and acrylic.

For example, the display substrate in at least one embodiment of the present disclosure further includes: a second encapsulating layer between the first encapsulating layer and the base substrate; and a third encapsulating layer on a side of the first encapsulating layer away from the base substrate; the first encapsulating layer is an organic layer, and the second encapsulating layer and the third encapsulating layer are inorganic layers.

For example, in the display substrate in at least one embodiment of the present disclosure, an orthographic projection of the barrier dam on the base substrate is outside orthographic projections of the first encapsulating layer and the second encapsulating layer on the base substrate; the orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate.

For example, in the display substrate in at least one embodiment of the present disclosure, an orthographic projection of at least one barrier dam on the base substrate is within orthographic projections of the first encapsulating layer and the second encapsulating layer on the base substrate, and an orthographic projection of at least one barrier dam on the base substrate is outside the orthographic projections of the first encapsulating layer and the second encapsulating layer on the base substrate; the orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate.

For example, the display substrate in at least one embodiment of the present disclosure further includes a plurality of organic light emitting devices, and the plurality of organic light emitting devices are in the display area and between the first encapsulating layer and the base substrate.

For example, the display substrate in at least one embodiment of the present disclosure further includes a planarization layer, the planarization layer is between the organic light emitting device and the base substrate, and the barrier dam is at least partially in the same layer and made of the same material as the planarization layer.

For example, in the display substrate in at least one embodiment of the present disclosure, a material of the planarization layer includes polymethyl methacrylate, polyimide, epoxy resin, polyamide, or acrylic acid.

At least one embodiment of the present disclosure provides a display panel including the display substrate of any forgoing embodiment.

At least one embodiment of the present disclosure provides a method for fabricating a display substrate, including: providing a base substrate, and defining, on the base substrate, a display area and a non-display area around the display area of the display substrate to be formed; forming a barrier dam on the base substrate in the non-display area; applying a first encapsulating material on the base substrate in the display area; and curing the first encapsulating material to form a first encapsulating layer; wherein at least a side of the barrier dam facing the first encapsulating layer is lyophobic with respect to the first encapsulating material before curing.

For example, in the method in at least one embodiment of the present disclosure, after forming the barrier dam and before applying the first encapsulating material on the base substrate, a modification process is performed on the barrier dam with a halogen element and/or an inert gas.

BRIEF DESCRIPTION OF THE DRAWINGS

In order to more clearly illustrate the technical solutions of the embodiments of the present disclosure, the drawings of the embodiments will be briefly described below, and it is apparent that the drawings described below only relate to some embodiments of the present disclosure, are not intended to limit the present disclosure.

DETAILED DESCRIPTION

Figure 1A:
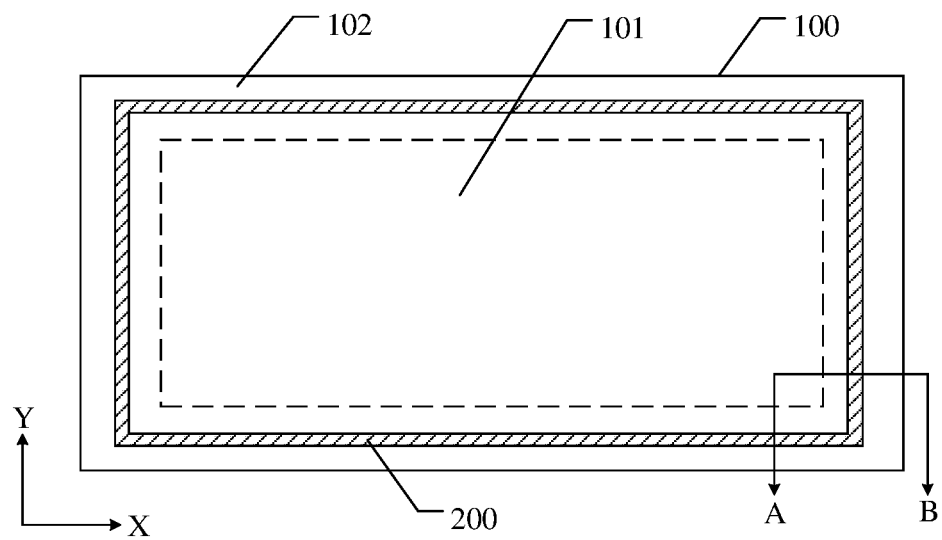
FIG. 1A is a plan view of a partial structure of a display substrate according to an embodiment of the present disclosure.

In order to make the objects, technical solutions and advantages of the embodiments of the present disclosure clearer, the technical solutions of the embodiments of the present disclosure will be clearly and completely described below with reference to the drawings of the embodiments of the present disclosure. It is to be understood that the embodiments described are only some, not all, embodiments of the present disclosure. All other embodiments, which can be conceived by a person skilled in the art from the described embodiments of the present disclosure without any creative effort, are within the protection scope of the present disclosure.

Unless otherwise defined, technical or scientific terms used herein shall have the same meaning as commonly understood by one of ordinary skill in the art to which the present disclosure pertains. The terms "first", "second", and the like used herein is not intended to indicate any order, quantity, or importance, but rather is used to distinguish one element from another. The term "comprise", "include", or the like, means that an element or item before the term encompasses the element(s) or item(s) listed after the term and equivalents thereof, but does not preclude other element(s) or item(s). The terms "connected", "coupled" and the like are not restricted to physical or mechanical connection, but may include electrical connection, whether direct or indirect. The terms "above", "under", "left", "right", and the like are used merely to indicate relative positional relationships, and when the absolute position of an object being described is changed, the relative positional relationships may also be changed accordingly.

For example, a barrier dam may be disposed along the periphery of a display substrate, and during the encapsulation of the display substrate, the barrier dam may block an encapsulating material (e.g., the encapsulating material is in the form of ink in an inkjet printing process), which forms an encapsulating layer after being dried and cured. If the height of the barrier dam is not enough, the encapsulating material overflows, which results in a waste of material, and causes the encapsulating layer formed of the encapsulating material to have poor flatness and small thickness, limiting the encapsulation effect of the encapsulating layer. However, if the height of the barrier dam is increased, a level difference in the region where the barrier dam is located will be increased, which not only increases the thickness of the display substrate and increases the difficulty of the fabricating process, but also has an adverse effect on the subsequent fabricating process of the display substrate.

At least one embodiment of the present disclosure provides a display substrate including a display area and a non-display area around the display area. The display substrate further includes a base substrate, and a first encapsulating layer and at least one barrier dam on the base substrate, the barrier dam is on the base substrate in the non-display area, the first encapsulating layer is on the base substrate and on a side of the at least one barrier dam facing the display area, the first encapsulating layer is formed of a first encapsulating material in a cured state, and at least a side of the barrier dam facing the first encapsulating layer is lyophobic with respect to the first encapsulating material in a non-cured state. In the display substrate, the barrier dam can prevent overflow of the first encapsulating material for forming the first encapsulating layer, thereby improving the flatness of the first encapsulating layer. Moreover, compared with the structure of a current display substrate, in the case of a same thickness of the barrier dam, the barrier dam in the embodiment of the present disclosure can further enable the display substrate to hold more first encapsulating material in the encapsulation process, thereby increasing the thickness of the first encapsulating layer. Therefore, the barrier dam according to the embodiment of the present disclosure can improve the encapsulation effect of the display substrate.

Hereinafter, a display substrate, a method for fabricating the same, and a display panel according to at least one embodiment of the present disclosure will be described with reference to the accompanying drawings.

Figure 1B:
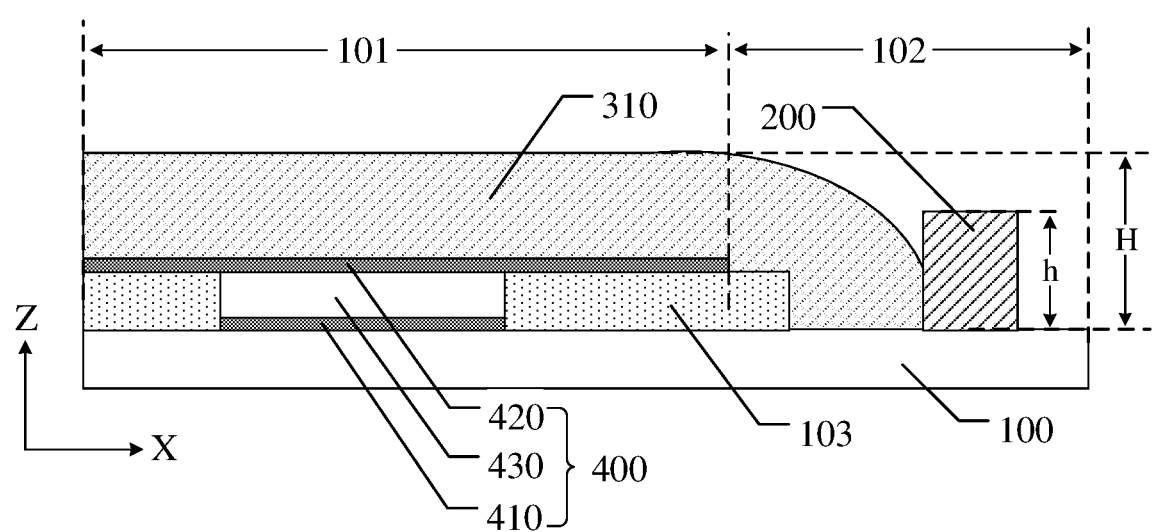
FIG. 1B is a cross-sectional view of the display substrate shown in FIG. 1A taken along A-B.

FIG. 1A is a plan view of a partial structure of a display substrate according to an embodiment of the present disclosure, and FIG. 1B is a cross-sectional view of the display substrate shown in FIG. 1A taken along A-B.

For example, in a display substrate according to at least one embodiment of the present disclosure, as shown in FIGS. 1A and 1B, the display substrate includes a display area 101 and a non-display area 102 around the display area 101. The display substrate further includes a base substrate 100, a barrier dam 200 is located on the base substrate 100 in the non-display area 102, a first encapsulating layer 310 is located on the base substrate 100 and on a side of the barrier dam 200 facing the display area 101, the first encapsulating layer 310 is formed of a first encapsulating material in a cured state (not shown, and referring to the first encapsulating material 301 in FIG. 9F), and at least a side of the barrier dam 200 facing the first encapsulating layer 310 is lyophobic with respect to the first encapsulating material in a non-cured state. The display area 101 is the area defined by the dashed box in FIG. 1A.

Next, the position of each component of the display substrate in at least one embodiment of the present disclosure described below is explained by establishing a spatial rectangular coordinate system with reference to the base substrate 100. As an example, as shown in FIGS. 1A and 1B, in the above-described spatial rectangular coordinate system, X-axis and Y-axis directions are parallel to a surface of the base substrate 100 facing the barrier dam 200, and Z-axis direction is perpendicular to the surface of the base substrate 100 facing the barrier dam 200.

Further, in at least one embodiment of the present disclosure described below, "above", "under", "height", and "thickness" are defined relative to the surface of the base substrate 100 facing the barrier dam 200. Further, by taking the barrier dam 200 as an example, the "height" and "thickness" of the barrier dam 200 are not limited by other component(s) (e.g., a thin film transistor 500 shown in FIG. 6, etc.) disposed between the base substrate 100 and the barrier dam 200. As an example, by taking the embodiment shown in FIG. 3 and described below as an example, a photoresist layer 230 is above a first barrier layer 210, a first barrier layer 210 is below the photoresist layer 230, the thickness of the photoresist layer 230 is the distance from a surface of the photoresist layer 230 facing away from the base substrate 100 to a surface of the photoresist layer 230 facing the base substrate 100, and the height of the photoresist layer 230 is the distance from the surface of the photoresist layer 230 facing away from the base substrate 100 to the surface of the base substrate 100 facing the photoresist layer 230.

For example, as shown in FIGS. 1A and 1B, the surface of the barrier dam 200 facing the base substrate 100 is a lower surface, and the surface of the barrier dam 200 away from the base substrate 100 is an upper surface; the first encapsulating layer 310 is above the base substrate 100 (or an organic light emitting device 400 in the embodiment described below), and the base substrate 100 (or the organic light emitting device 400 in the embodiment described below) is below the first encapsulating layer 310.

Figure 6:
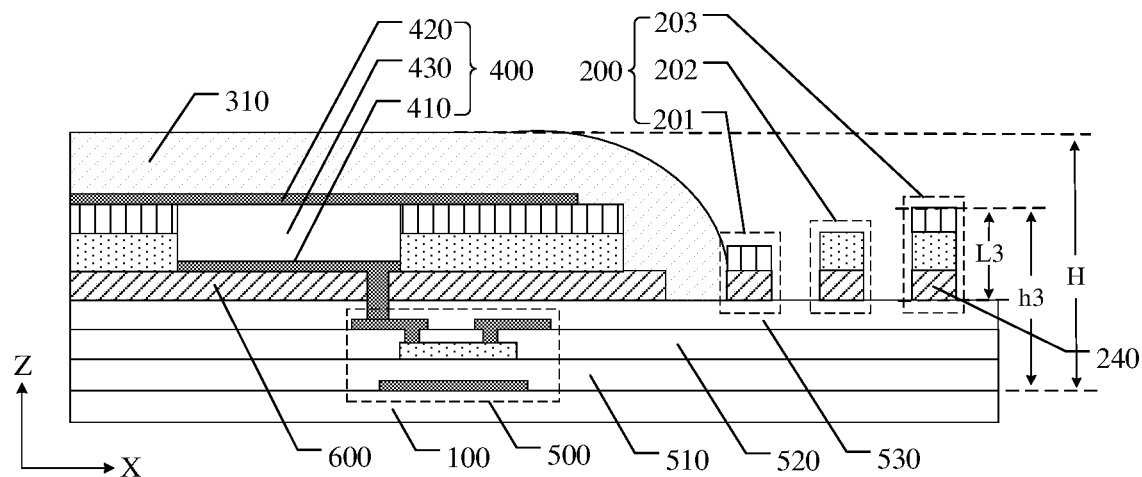
FIG. 6 is a cross-sectional view of another display substrate according to an embodiment of the present disclosure.

For example, the height of the barrier dam 200 is the distance from the upper surface of the barrier dam 200 to the surface of the base substrate 100 facing the barrier dam 200; the thickness of the barrier dam 200 is a dimension of the barrier dam 200 in the Z-axis direction. As an example, as shown in FIG. 1B, the height of the barrier dam 200 is h, and the height of the first encapsulating layer 310 is H; further, as shown in FIG. 6 in the following embodiment, the thin film transistor 500 and the like are provided between the barrier dam 200 and the base substrate 100, the height of a third barrier dam 203 of the barrier dam 200 is h3, the thickness of the third barrier dam 203 is L3, and the height of the first encapsulating layer 310 is H.

For example, during the fabrication of the display substrate, a first encapsulating material is applied within an area defined by the barrier dam. Since the side (side surface) of the barrier dam facing the first encapsulating layer is lyophobic with respect to the first encapsulating material, a contact angle of the first encapsulating material on the side surface is larger than 90 degrees, so that the first encapsulating material is prevented from climbing over the side surface of the barrier dam, and the height of a central portion (a portion in the display area) of the first encapsulating material may be larger than the height of an edge portion (a portion near the barrier dam) of the first encapsulating material. For example, the height of the central portion of the first encapsulating material may be greater than the height of the barrier dam. Compared with the current display substrate, the amount of the first encapsulating material applied on the display substrate can be less limited by the height of the barrier dam, and it is more difficult for the first encapsulating material to overflow beyond the barrier dam, so that the first encapsulating layer with a larger thickness can be formed; further, except the edge portion of the first encapsulating material, the central portion of the first encapsulating material (e.g., at least the portion of the first encapsulating material in the display area) is a substantially flat surface, so that the flatness of the surface of the first encapsulating layer formed after the first encapsulating material is dried is higher. Therefore, the encapsulation yield of the display substrate can be improved.

It should be noted that the first encapsulating material needs to be dried to form the first encapsulating layer, so the thickness of the first encapsulating layer is usually smaller than that of the first encapsulating material. In at least one embodiment of the present disclosure, the height relationship between the first encapsulating layer and the barrier dam is not limited, and the height of the first encapsulating layer may be greater than, less than, or equal to the height of the barrier dam.

For example, in the display substrate in at least one embodiment of the present disclosure, a distance from the surface of the first encapsulating layer away from the base substrate to the surface of the base substrate facing the first encapsulating layer is greater than a distance from the surface of the barrier dam away from the base substrate to the surface of the base substrate facing the first encapsulating layer. As an example, as shown in FIG. 1B, the height H of the first encapsulating layer 310 is greater than the height h of the barrier dam 200.

For example, in the display substrate in at least one embodiment of the present disclosure, a planer shape of the barrier dam is a closed loop surrounding the display area. As an example, as shown in FIG. 1A, the shape of the barrier dam 200 in the X-Y plane is a closed loop, with the display area 101 being located inside the closed loop. As such, the barrier dam 200 can further reduce overflow of the first encapsulating material for forming the first encapsulating layer, thereby further improving the encapsulation yield of the display substrate.

Figure 2:
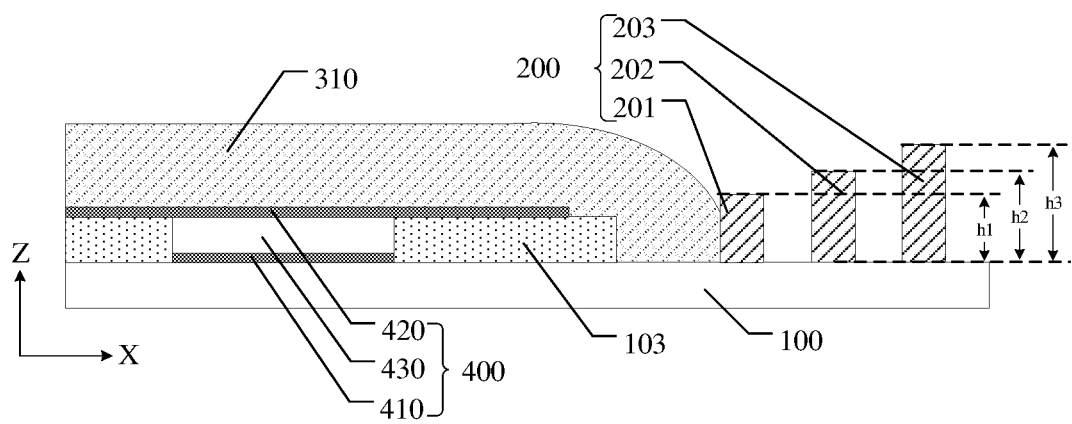
FIG. 2 is a cross-sectional view of another display substrate according to an embodiment of the present disclosure.

FIG. 2 is a cross-sectional view of another display substrate according to an embodiment of the present disclosure.

For example, in a display substrate in at least one embodiment of the present disclosure, the display substrate includes a plurality of barrier dams, and the plurality of barrier dams are arranged to be spaced apart from each other. For example, the plurality of barrier dams may surround the display area and be arranged from the inside out at intervals. Thus, in an actual process, even if the first encapsulating material passes over the barrier dam close to the display area, the barrier dam far away from the display area can prevent the first encapsulating material from overflowing, and the risk that the first encapsulating material overflows can be further reduced.

In at least one embodiment of the present disclosure, the height relationship among the plurality of barrier dams is not limited as long as the barrier dams can prevent the first encapsulating material from overflowing. For example, in some embodiments of the present disclosure, the height of each of the barrier dams is the same. For example, in other embodiments of the present disclosure, the height of the barrier dam close to the display area is less than the height of the barrier dam far away from the display area. Thus, the depth of an opening formed between adjacent barrier dams can be decreased, and the quality of the encapsulating layer during film forming is improved when a subsequent process such as the formation of the encapsulating layer in the following embodiments is performed. The height of the barrier dam close to the display area is relatively low, so that the adverse effect of the barrier dam close to the display area on components in the display area can be reduced. The height of the barrier dam far away from the display area is relatively high, so that the barrier dam can cooperate with the encapsulating layer to extend the invasion path of moisture and oxygen, reduce the invasion risk of moisture and oxygen, and further improve the encapsulation effect of the display substrate.

For example, in the display substrate in at least one embodiment of the present disclosure, the plurality of barrier dams include a first barrier dam and a second barrier dam, the first barrier dam is between the second barrier dam and the display area, and a distance from the surface of the first barrier dam away from the base substrate to the surface of the base substrate facing the first barrier dam is smaller than a distance from a surface of the second barrier dam away from the base substrate to a surface of the base substrate facing the second barrier dam.

For another example, in the display substrate in at least one embodiment of the present disclosure, the plurality of barrier dams include a first barrier dam, a second barrier dam, and a third barrier dam, the first barrier dam is between the second barrier dam and the display area, the third barrier dam is on a side of the second barrier dam away from the first barrier dam, and a distance from a surface of the second barrier dam away from the base substrate to a surface of the base substrate facing the second barrier dam is smaller than a distance from a surface of the third barrier dam away from the base substrate to a surface of the base substrate facing the third barrier dam.

As an example, as shown in FIG. 2, the barrier dam 200 provided on the display substrate includes a first barrier dam 201, a second barrier dam 202 and a third barrier dam 203 spaced apart from each other, the first barrier dam 201, the second barrier dam 202 and the third barrier dam 203 are arranged in this order in a direction (positive X-axis direction) away from the display area, and the heights of the first barrier dam 201, the second barrier dam 202 and the third barrier dam 203 increase in this order.

In at least one embodiment of the present disclosure, the type of the display substrate is not limited. For example, the display substrate is an OLED display substrate, and the display substrate further includes a plurality of organic light emitting devices in the display area and between the first encapsulating layer and the base substrate. As an example, as shown in FIG. 1B, the organic light emitting device 400 is between the first encapsulating layer 310 and the base substrate 100, and the organic light emitting device 400 includes a first electrode layer 410, an organic light emitting functional layer 430 and a second electrode layer 420, which are sequentially stacked on the base substrate 100. For example, one of the first electrode layer 410 and the second electrode layer 420 is an anode, and the other of the first electrode layer 410 and the second electrode layer 420 is a cathode. The first encapsulating layer 310 covers the organic light emitting device 400, so that the organic light emitting functional layer, the cathode, and the like are prevented from aging due to reaction with external substances such as invading moisture, oxygen, etc., thereby ensuring the performance of the organic light emitting device 400 and prolonging the service life of the organic light emitting device 400. In addition, the first encapsulating layer 310 has high flatness and a large thickness, which can improve the flatness of the surface of the display substrate and relieve the stress, thereby reducing the mechanical damage of the display substrate and protecting the display substrate.

For example, as shown in FIG. 1B, the second electrode layer 420 may be provided as a common driving electrode of a plurality of organic light emitting devices 400. For example, the organic light emitting functional layer in the organic light emitting device may include a hole injection layer, a hole transport layer, an organic light emitting layer, an electron transport layer, an electron injection layer, and the like, and may further include a hole blocking layer, an electron blocking layer, and the like, for example.

In the following, a display substrate in at least one embodiment of the present disclosure will be described by taking an example in which the display substrate is an OLED display substrate.

Figure 3:
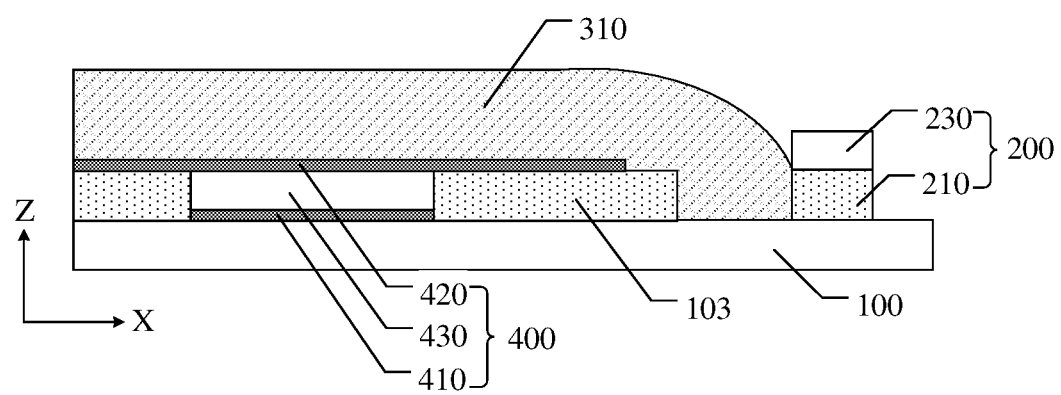
FIG. 3 is a cross-sectional view of another display substrate according to an embodiment of the present disclosure.

FIG. 3 is a cross-sectional view of another display substrate according to an embodiment of the present disclosure.

For example, the display substrate in at least one embodiment of the present disclosure further includes a pixel defining layer on the base substrate, and the pixel defining layer is between the base substrate and the first encapsulating layer. As an example, as shown in FIG. 3, the pixel defining layer 103 has a single-layer structure, the pixel defining layer 103 is between the first encapsulating layer 310 and the base substrate 100, and the organic light emitting functional layer 430 of the organic light emitting device 400 may be formed in openings of the pixel defining layer 103, which allow adjacent pixel units to be spaced apart from each other to prevent interference with each other. For example, at least part of structures of the organic light emitting functional layer 430 such as a hole injection layer, a hole transport layer, an organic light emitting layer, or the like may be fabricated in the opening of the pixel defining layer 103 using inkjet printing.

It should be noted that, in at least one embodiment of the present disclosure, some of the film layers in the organic light emitting functional layer 430 may be formed by inkjet printing, and other film layers may be formed by evaporation or the like. As an example, some film layers such as a hole injection layer and the like may be formed in the opening of the pixel defining layer by inkjet printing, and then other film layers such as an organic light emitting layer, an electron injection layer and the like may be formed by an evaporation process. As such, the depth of the remaining space of the opening becomes smaller as the film layers formed in the opening increase, and the thickness of the film layer (such as the organic light emitting layer) formed subsequently can be ensured by the evaporation process without increasing the thickness of the pixel defining layer.

Figure 4:
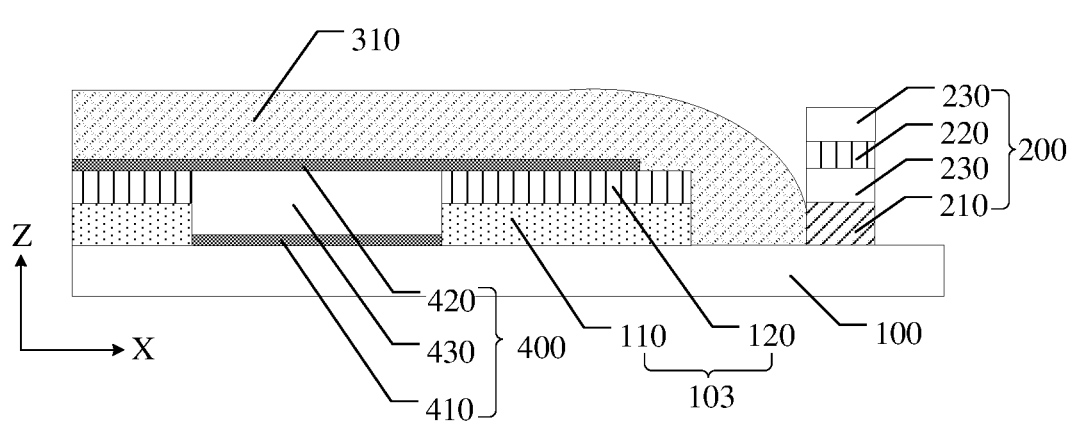
FIG. 4 is a cross-sectional view of another display substrate according to an embodiment of the present disclosure.

FIG. 4 is a cross-sectional view of another display substrate according to an embodiment of the present disclosure.

For example, in the display substrate in at least one embodiment of the present disclosure, the pixel defining layer includes a first defining layer and a second defining layer stacked on each other, and the first defining layer is between the second defining layer and the base substrate. As an example, as shown in FIG. 4, the pixel defining layer 103 includes a first defining layer 110 and a second defining layer 120 stacked on each other, and the second defining layer 120 is between the first encapsulating layer 310 and the first defining layer 110. For example, the second defining layer 120 may be used to increase the height of the first defining layer 110 so that the capacity of the opening defined by the second defining layer 120 and the first defining layer 110 increases, thereby increasing the thickness of the organic light emitting functional layer 430 and improving the light emitting function of the organic light emitting device. For example, an orthographic projection of the second defining layer 120 on the base substrate 100 coincides with an orthographic projection of the first defining layer 110 on the base substrate 100.

In at least one embodiment of the present disclosure, the formation of the barrier dam is not limited. For example, in some embodiments of the present disclosure, the barrier dam may be separately formed, and thus, parameters such as material, thickness, and the like of the barrier dam are not limited by the fabricating process of the display substrate. For example, in other embodiments of the present disclosure, the barrier dam may be simultaneously formed in a process of fabricating a component (other component except the barrier dam) in the display substrate, and thus, there is no need to increase the fabricating process of the display substrate, and the cost is reduced.

For example, in the display substrate in at least one embodiment of the present disclosure, the pixel defining layer has a single-layer structure, the barrier dam includes a first barrier layer, and the first barrier layer is in the same layer and made of the same material as the pixel defining layer. As an example, in the display substrate as shown in FIG. 3, the barrier dam 200 includes a first barrier layer 210. In the process of fabricating the display substrate, after an insulating material film is formed on the base substrate 100, a patterning process may be performed on the insulating material film to simultaneously form the pixel defining layer 103 and the first barrier layer 210.

For example, in the display substrate in at least one embodiment of the present disclosure, the pixel defining layer has a single-layer structure, the barrier dam includes a first barrier layer and a photoresist layer, the first barrier layer is between the base substrate and the photoresist layer, and the first barrier layer is in the same layer and made of the same material as the pixel defining layer. As an example, in the display substrate shown in FIG. 3, the barrier dam 200 includes a photoresist layer 230, and the photoresist layer 230 is above the first barrier layer 210. In the process of fabricating the display substrate, a patterning process may be performed on an insulating material film for forming the pixel defining layer 103 and the first barrier layer 210 using a photoresist, and after the patterning process is completed, the photoresist on the first barrier layer 210 remains, thereby obtaining the photoresist layer 230. The photoresist layer 230 can increase the height of the barrier layer 200, so that more first encapsulating material can be applied on the display substrate, thereby increasing the thickness of the first encapsulating layer 310 and improving the encapsulation effect of the display substrate.

For example, in the display substrate in at least one embodiment of the present disclosure, the pixel defining layer includes a first defining layer and a second defining layer stacked on each other, the first defining layer is between the second defining layer and the base substrate, the barrier dam includes a first barrier layer and a second barrier layer, the first barrier layer is in the same layer and made of the same material as the first defining layer, and the second barrier layer is in the same layer and made of the same material as the second defining layer. As an example, in the display substrate shown in FIG. 4, the barrier dam 200 includes a first barrier layer 210 and a second barrier layer 220 sequentially stacked on the base substrate 100. For example, in the process of fabricating the display substrate, a patterning process may be performed on a thin film to form the first defining layer 110 and the first barrier layer 210, and a patterning process may be performed on another thin film to form the second defining layer 120 and the second barrier layer 220.

For example, in the display substrate in at least one embodiment of the present disclosure, the barrier dam includes a first barrier layer, a second barrier layer and at least one photoresist layer stacked on one another, the first barrier layer is in the same layer and made of the same material as the first defining layer, the second barrier layer is in the same layer and made of the same material as the second defining layer, and the photoresist layer is on a side of the first barrier layer or the second barrier layer away from the base substrate. As an example, in the display substrate shown in FIG. 4, the barrier dam 200 includes a photoresist layer 230, and the photoresist layer 230 is disposed between the first barrier layer 210 and the second barrier layer 220 and above the second barrier layer 220. The photoresist layer 230 may be formed using the photoresist used in the patterning process for forming the first and second defining layers 110 and 120. The photoresist layer 230 can increase the height of the barrier layer 200, so that more first encapsulating material can be applied on the display substrate, thereby increasing the thickness of the first encapsulating layer 310 and improving the encapsulation effect of the display substrate.

Figure 5:
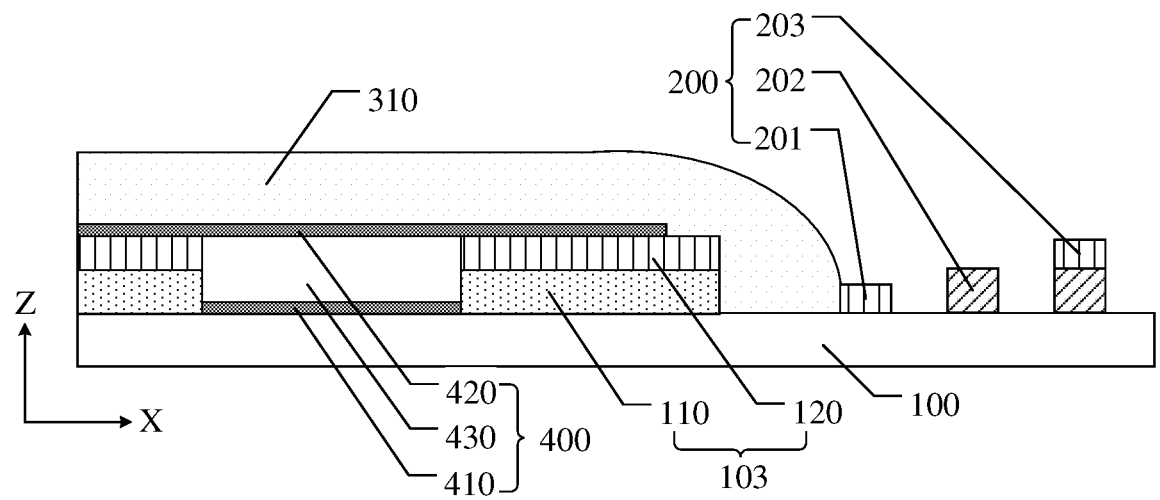
FIG. 5 is a cross-sectional view of another display substrate according to an embodiment of the present disclosure.

FIG. 5 is a cross-sectional view of another display substrate according to an embodiment of the present disclosure.

For example, in at least one embodiment of the present disclosure, the first defining layer and the second defining layer of the pixel defining layer have different thicknesses. Thus, without increasing the fabricating process of the display substrate, a plurality of barrier dams which are arranged at intervals can be disposed on the display substrate, and the heights of the plurality of barrier dams sequentially increase along the direction from the display area to the non-display area.

For example, in at least one embodiment of the present disclosure, in the case where the thickness of the first defining layer is different from the thickness of the second defining layer, a plurality of barrier dams are provided, and one of the plurality of barrier dams is in the same layer and made of the same material as the first defining layer, another one of the plurality of barrier dams is in the same layer and made of the same material as the second defining layer, and another one of the plurality of barrier dams is in the same layer and made of the same material as the first defining layer and the second defining layer. As such, the heights of at least three barrier dams are different from each other, and the formation of the three barrier dams does not increase the fabricating process of the display substrate.

It should be noted that in at least one embodiment of the present disclosure, "in the same layer and made of same material" may mean that two structures may be formed from one film layer, for example, the two structures may be formed in one patterning process performed on the film layer.

Hereinafter, in the case where the pixel definition layer includes the first defining layer and the second defining layer having different thicknesses, a display substrate in at least one embodiment of the present disclosure will be described by taking the case that the thickness of the first defining layer is greater than the thickness of the second defining layer as an example.

As an example, as shown in FIG. 5, the display substrate includes a first barrier dam 201, a second barrier dam 202 and a third barrier dam 203 arranged in this order in a direction away from the display area (positive X-axis direction). The first barrier dam 201 and the second defining layer 120 are in a same layer and made of a same material; the second barrier dam 202 and the first defining layer 110 are in a same layer and made of a same material; further, a portion of the third barrier dam 203 close to the base substrate 100 is in the same layer and made of the same material as the first defining layer 110, and a portion of the third barrier dam 203 away from the base substrate 100 is in the same layer and made of the same material as the second defining layer 120. In this way, the height of the third barrier dam 203 can be made larger than the height of the second barrier dam 202, and the height of the second barrier dam 202 can be made larger than the height of the first barrier dam 201 without increasing the fabricating process of the display substrate.

In at least one embodiment of the present disclosure, the thicknesses of the first encapsulating layer and the pixel defining layer are not limited, and may be designed according to an actual process. For example, the thickness of the first encapsulating layer may be 3 to 10 microns; in the case that the pixel defining layer has a single-layer structure, the thickness of the pixel defining layer may be 1 to 2 microns; and in the case where the pixel defining layer includes a first defining layer and a second defining layer, the first defining layer may have a thickness of 1 to 2 microns, and the second defining layer may have a thickness of 1 to 1.5 microns.

For example, in at least one embodiment of the present disclosure, in the case where a plurality of barrier dams are provided, the distance between the barrier dams is not limited. For example, the distance between the barrier dams in a direction parallel to the X-Y plane is 10 to 100 microns, such as about 30 microns, about 50 microns, about 80 microns, or the like.

For example, in at least one embodiment of the present disclosure, the width of the barrier dam is not limited. For example, the width of the barrier dam in the direction parallel to the X-Y plane is 10 to 100 microns, for example, about 30 microns, about 50 microns, about 80 microns, or the like.

In at least one embodiment of the present disclosure, the material of the first defining layer and the second defining layer is not limited. For example, the first defining layer may be made of a polymer resin material such as one or more of polymethyl methacrylate, polyimide, acrylic acid, and the like, or may be made of a photoresist. For example, the second defining layer may be made of a polymer resin material such as polyimide or the like. It should be noted that, in the case where the first barrier layer of the barrier dam and the first defining layer are in a same layer and are made of a same material, if the first defining layer is made of photoresist, the photoresist layer does not need to be formed on the surface of the first barrier layer away from the base substrate.

FIG. 6 is a cross-sectional view of another display substrate according to an embodiment of the present disclosure.

For example, the display substrate in at least one embodiment of the present disclosure further includes a planarization layer between the organic light emitting device and the base substrate. As an example, as shown in FIG. 6, a planarization layer 600 is disposed between the organic light emitting device 400 and the base substrate 100. In the fabricating process of the display substrate, the planarization layer 600 may planarize the surface of the display substrate before the organic light emitting device 400 is formed, thereby improving the yield of the organic light emitting device 400.

For example, in at least one embodiment of the present disclosure, the barrier dam is at least partially in the same layer and made of the same material as the planarization layer. As an example, as shown in FIG. 6, a portion of the barrier dam 200 close to the base substrate is in the same layer and made of the same material as the planarization layer 600. In this way, the thickness of the barrier dam 200 can be increased, and after the display substrate is encapsulated (for example, after a third encapsulating layer in the following embodiments is formed), the path along which moisture, oxygen and the like invade into the display substrate can be extended, so that the risk that moisture, oxygen and the like invade into the display substrate can be reduced, and the encapsulation effect of the display substrate can be improved.

In at least one embodiment of the present disclosure, the material of the planarization layer is not limited. For example, the material of the planarization layer may be acrylic material, which may be one or more of polymethyl methacrylate, polyimide, epoxy resin, polyamide, acrylic acid and the like, or may be other suitable material(s).

In at least one embodiment of the present disclosure, the encapsulation manner of the display substrate is not limited. For example, the display substrate may be encapsulated with a single-layer film (the first encapsulating layer) or may be encapsulated with a multi-layer film (including the first encapsulating layer). The encapsulation with a multi-layer film can further improve the encapsulation effect of the display substrate.

Figure 7:
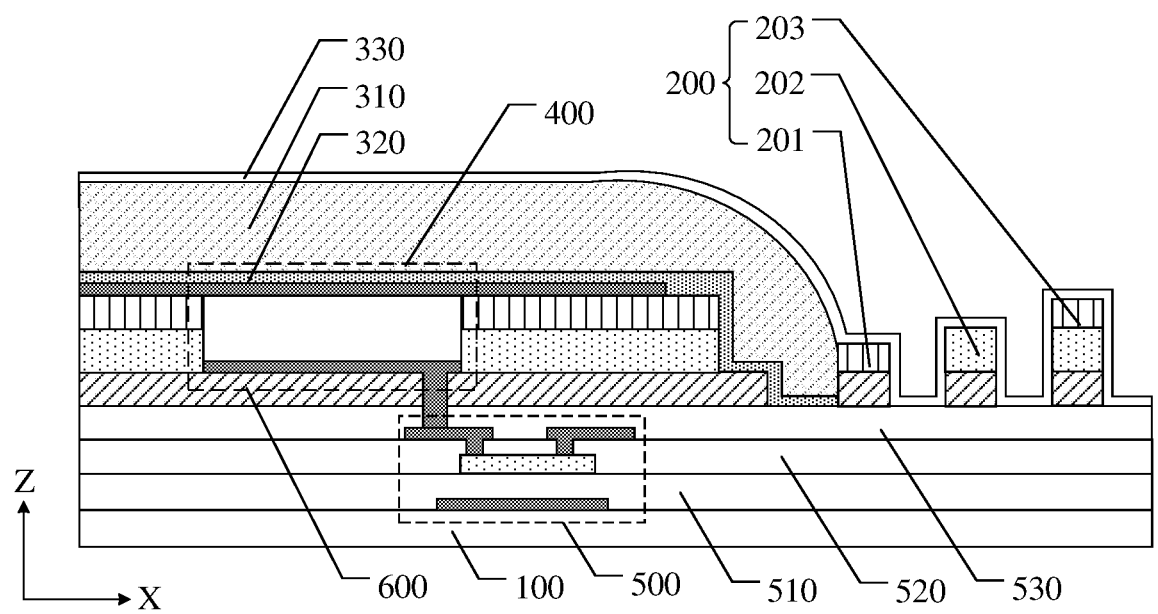
FIG. 7 is a cross-sectional view of another display substrate according to an embodiment of the present disclosure.

FIG. 7 is a cross-sectional view of another display substrate according to an embodiment of the present disclosure.

For example, the display substrate in at least one embodiment of the present disclosure further includes a second encapsulating layer and a third encapsulating layer, the second encapsulating layer is between the first encapsulating layer and the base substrate, and the third encapsulating layer is on a side of the first encapsulating layer away from the base substrate. As an example, as shown in FIG. 7, a second encapsulating layer 320 is disposed between a first encapsulating layer 310 and an organic light emitting device 400, and a third encapsulating layer 330 is disposed above the first encapsulating layer 310. The composite encapsulation stack composed of the first encapsulating layer 310, the second encapsulating layer 320 and the third encapsulating layer 330 can further improve the encapsulation effect of the display substrate.

For example, the first encapsulating layer is an organic layer, and the second encapsulating layer and the third encapsulating layer are inorganic layers. For example, the second encapsulating layer and the third encapsulating layer may be made of an inorganic material such as silicon nitride, silicon oxide, silicon oxynitride or fluoride, and the inorganic material has high compactness and can prevent intrusion of moisture, oxygen and the like. For example, the first encapsulating layer includes an organic material, for example, a polymer resin such as polyethylene terephthalate, polyacrylate or the like. In this way, the first encapsulating layer can relieve the stress of the second encapsulating layer and the third encapsulating layer, and a material such as a drying agent may be provided in the first encapsulating layer, so that substances such as moisture and oxygen which invade into the display substrate can be absorbed while the display substrate is encapsulated, and components in the display substrate can be further protected. For example, the drying agent may include a moisture-absorbing material, such as an alkali metal (e.g., Li, Na), an alkaline earth metal (e.g., Ba, Ca), or other moisture-reactive metal (e.g., Al, Fe); and may be alkali metal oxide (e.g., Li2O, Na2O), alkaline earth metal oxide (e.g., MgO, CaO, BaO), sulfate (e.g., anhydrous MgSO4), metal halide (e.g., CaCl2), perchlorate (e.g., Mg (ClO4)2), or the like, for absorbing substances such as moisture, oxygen and the like which invade into the display substrate.

In at least one embodiment of the present disclosure, the thicknesses of the second encapsulating layer and the third encapsulating layer are not limited. For example, each of the thickness of the second encapsulating layer and the thickness of the third encapsulating layer is not greater than 1 micron.

For example, in the display substrate in at least one embodiment of the present disclosure, an orthographic projection of the barrier dam on the base substrate is outside an orthographic projection of the second encapsulating layer on the base substrate, an orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate. As an example, as shown in FIG. 7, the second encapsulating layer 320 is on a side of the barrier dam 200 facing the display area, so that the barrier dam 200 is not covered by the second encapsulating layer 320, and the effect of the barrier dam 200 blocking the first encapsulating material is ensured; in addition, the third encapsulating layer 330 covers the first encapsulating layer 310, which can prevent external moisture, oxygen, and the like from entering the first encapsulating layer 310; and the third encapsulating layer 330 covers the barrier dam 200, so that the third encapsulating layer 330 and the barrier dam 200 can cooperate to lengthen the path along which the external moisture, oxygen, and the like invade into the display substrate. In this way, the first encapsulating layer 310, the second encapsulating layer 320 and the third encapsulating layer 330 can further improve the encapsulation effect of the display substrate.

Figure 8:
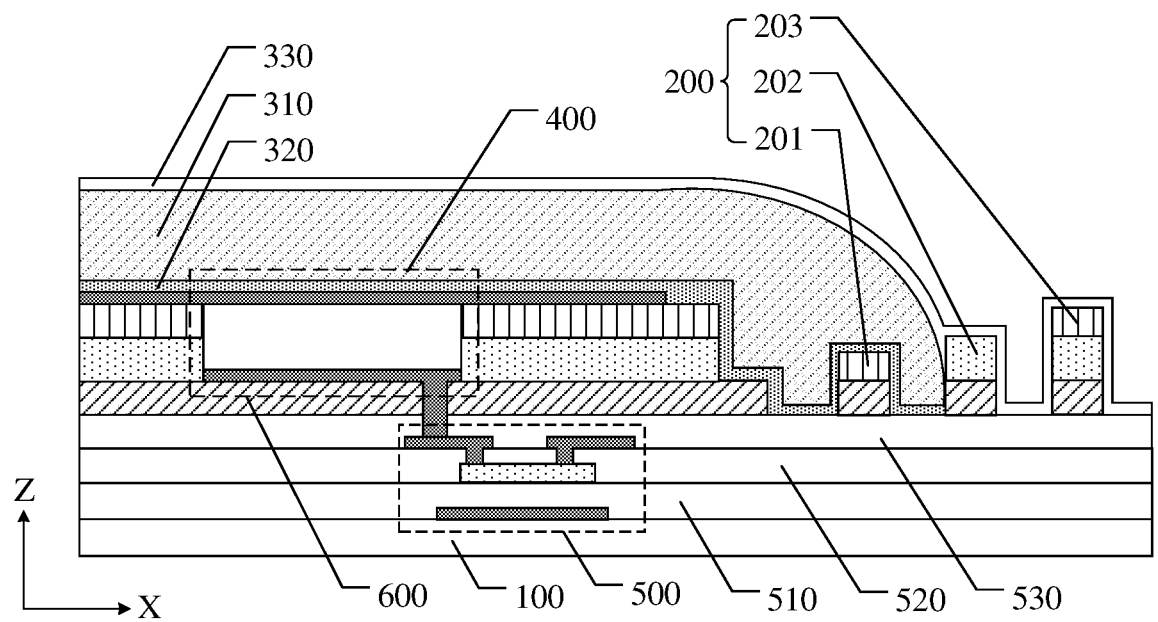
FIG. 8 is a cross-sectional view of another display substrate according to an embodiment of the present disclosure.

FIG. 8 is a cross-sectional view of another display substrate according to an embodiment of the present disclosure.

It should be noted that, in at least one embodiment of the present disclosure, in the case where a plurality of barrier dams are disposed on the display substrate, the second encapsulating layer may be disposed to cover at least one barrier dam and not cover at least one barrier dam, so as to improve the encapsulation effect of the display substrate. For example, in the display substrate in at least one embodiment of the present disclosure, an orthographic projection of at least one barrier dam on the base substrate is within orthographic projections of the first encapsulating layer and the second encapsulating layer on the base substrate, and an orthographic projection of at least one barrier dam on the base substrate is outside the orthographic projections of the first encapsulating layer and the second encapsulating layer on the base substrate; and the orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate.

As an example, as shown in FIG. 8, the display substrate includes a first barrier dam 201, a second barrier dam 202 and a third barrier dam 203 arranged in this order in the direction away from the display area (positive X-axis direction), and the second encapsulating layer 320 is disposed to cover the first barrier dam 201, and the second barrier dam 202 and the third barrier dam 203 are not covered by the second encapsulating layer 220. Thus, the first barrier dam 201 improves the encapsulation effect of the second encapsulating layer 320, and the first encapsulating material for forming the first encapsulating layer 310 is still blocked by the second barrier dam 202 and the third barrier dam 203. Thus, the encapsulation effect of the display substrate can be further improved while ensuring the thickness, flatness and the like of the first encapsulating layer.

For example, in at least one embodiment of the present disclosure, the display substrate may further include a driving circuit layer and the like disposed on the base substrate. For example, the driving circuit layer includes a plurality of switching elements, capacitors, gate lines, data lines, power lines, and the like, and the switching element may be, for example, a thin film transistor, which is connected to the organic light emitting device to control electrical functions of the organic light emitting device. As an example, in the embodiments shown in FIGS. 6 to 8, the display substrate includes a driving circuit layer including a plurality of thin film transistors 500 (one thin film transistor is shown as an example) and interlayer structures such as a gate insulating layer 510, an interlayer dielectric layer 520, a passivation layer 530 and the like disposed in cooperation with the thin film transistors 500.

It should be noted that, in at least one embodiment of the present disclosure, the type of the thin film transistor is not limited. The thin film transistor may be of a top gate type, a bottom gate type, a double gate type, or the like. The positions of the interlayer structures such as the gate insulating layer, the interlayer dielectric layer and the passivation layer may be arranged according to the type of the thin film transistor.

At least one embodiment of the present disclosure provides a display panel including the display substrate in any one of the foregoing embodiments. For example, the display panel may include an encapsulating cover plate arranged to be opposite to the display substrate, and the encapsulating cover plate may be above the first encapsulating layer (or the third encapsulating layer), and can provide further protection for components in the display substrate. For example, the display panel may be any product or component with a display function, such as a television, a digital camera, a mobile phone, a watch, a tablet computer, a notebook computer, a navigator or the like.

It should be noted that, for clarity, the present disclosure does not describe the entire structure of the display panel in at least one embodiment of the present disclosure. In order to achieve necessary functions of the display panel, other structure(s) (e.g., a touch structure, etc.) may be provided by those skilled in the art according to a specific application scenario, and the embodiments of the present disclosure are not limited thereto.

At least one embodiment of the present disclosure provides a method for fabricating a display substrate, including: providing a base substrate, and defining, on the base substrate, a display area and a non-display area around the display area of a display substrate to be formed; forming at least one barrier dam on the base substrate in the non-display area; applying a first encapsulating material on the base substrate in the display area; and curing the first encapsulating material to form a first encapsulating layer. At least a side of the barrier dam facing the first encapsulating layer is lyophobic with respect to the first encapsulating material in a non-cured state. In the display substrate obtained by using the above method, the barrier dam can prevent overflow of the first encapsulating material for forming the first encapsulating layer, so that the flatness of the first encapsulating layer is improved, and more first encapsulating material can be kept in the display substrate in the encapsulation process, thereby increasing the thickness of the first encapsulating layer, and improving the encapsulation effect of the display substrate. For the structure of the display substrate obtained by using the above method, reference may be made to the related description in the foregoing embodiments, which is not repeated here.

For example, in the method for fabricating a display substrate according to at least one embodiment of the present disclosure, after forming the barrier dam and before applying the first encapsulating material on the base substrate, a modification process is performed on the barrier dam using a halogen element and/or an inert gas. For example, the modification process may be a plasma process or an ion doping process; also, for example, the modification process may use a mask to limit a modification processing area. Examples of the halogen element include fluorine, chlorine, bromine, and the like. For example, in a plasma process, respective plasma may be obtained from organic matters of these halogen elements, thereby producing a lyophobic coating on the surface of the barrier dam. The halogen element may modify a material of at least the surface of the barrier dam so that the barrier dam is lyophobic with respect to the first encapsulating material. As an example, the solvent of the first encapsulating material is water, and the barrier dam becomes hydrophobic after being doped with halogen elements. For example, the inert gas may be helium, neon, argon, krypton, or the like. For example, in the case where the inert gas is argon, the barrier dam may be modified by using plasma of argon and hydrogen.

FIGS. 9A to 9G are process diagrams of a method for fabricating a display substrate according to an embodiment of the present disclosure.

Next, a method for fabricating a display substrate in at least one embodiment of the present disclosure will be described by taking the case of fabricating the display substrate shown in FIG. 7 as an example. For example, as shown in FIGS. 9A to 9G and FIG. 7, processes of the method for fabricating the display substrate according to at least one embodiment of the present disclosure are as follows.

Figure 9A:
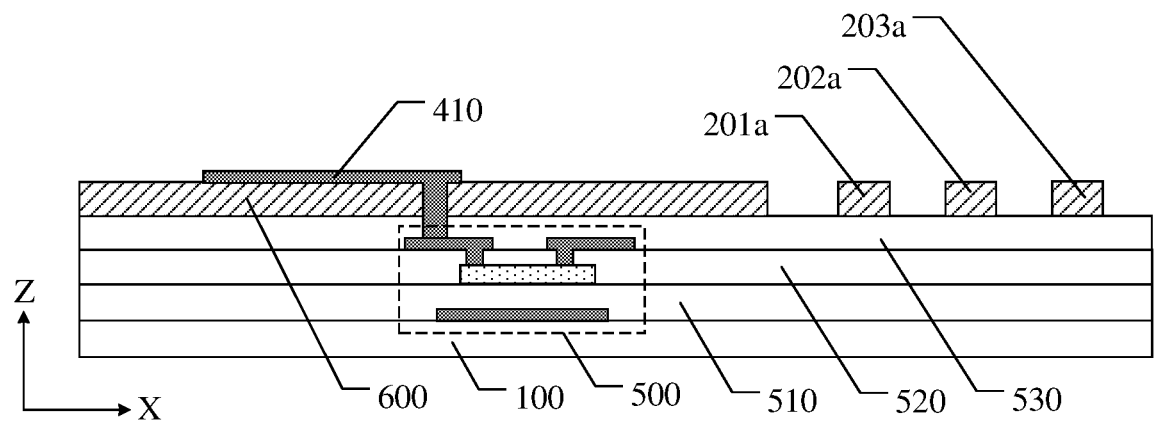
FIGS. 9A to 9G are process diagrams of a method for fabricating a display substrate according to an embodiment of the present disclosure.

As shown in FIG. 9A, a base substrate 100 is provided, and a driving circuit layer including a plurality of thin film transistors 500 (only one is shown in the drawing as an example) is formed on the base substrate 100. For example, a gate electrode, a gate insulating layer 510, an active layer, an interlayer dielectric layer 520, a source/drain electrode layer including a source electrode and a drain electrode spaced apart from each other, a passivation layer 530, and the like are sequentially formed on the base substrate 100. The thin film transistor 500 is a bottom gate type thin film transistor. Then, a planarization layer 600 is formed on the base substrate 100 to planarize the surface of the display substrate. Then, a patterning process is performed on the planarization layer 600 to form a via hole in the planarization layer 600 and the passivation layer 530. Then, the first electrode layer 410 is formed on the planarization layer 600, and the first electrode layer 410 is electrically connected to, for example, the drain electrode in the source/drain electrode layer through the via hole.

It should to be noted that, during the patterning process of the planarization layer 600, a portion of the planarization layer 600 in the non-display area 102 may be formed as a first portion 201a of a first barrier dam, a first portion 202a of a second barrier dam, and a first portion 203a of a third barrier dam.

For example, in at least one embodiment of the present disclosure, the patterning process may be a photolithographic patterning process, which may include, for example: coating a photoresist on a structural layer to be patterned, exposing the photoresist by using a mask, developing the exposed photoresist to obtain a photoresist pattern, etching the structural layer by using the photoresist pattern, and then optionally removing the photoresist pattern. It should be noted that if the patterned structural layer includes the photoresist, the process of coating the photoresist may not be required.

Figure 9B:
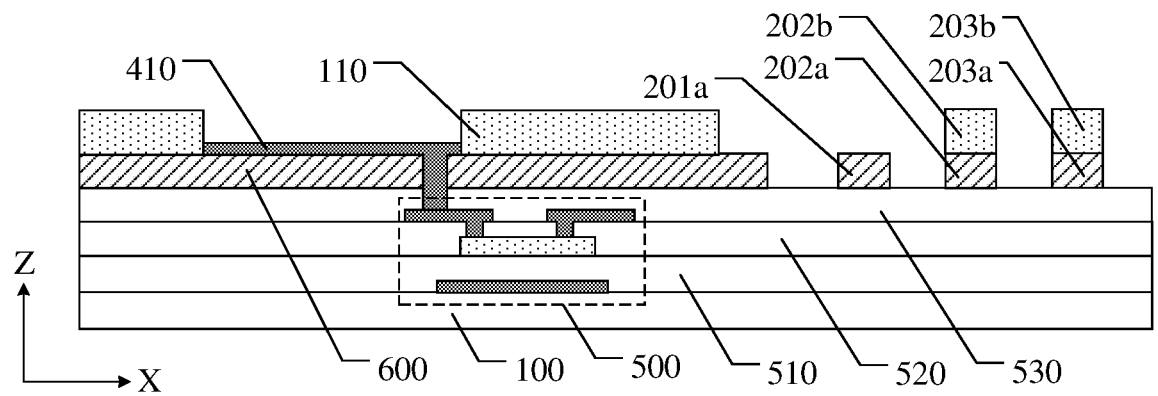

As shown in FIGS. 9A to 9B, a first defining layer 110 is formed on the base substrate 100, a patterning process is performed on the first defining layer 110, a plurality of openings are formed in the first defining layer 110 in the display area 101, and a portion of the first defining layer 110 in the non-display area 102 is formed as a second portion 202b of the second barrier dam and a second portion 203b of the third barrier dam. The second barrier dam and the third barrier dam are barrier dams to be formed in a subsequent process.

Figure 9C:
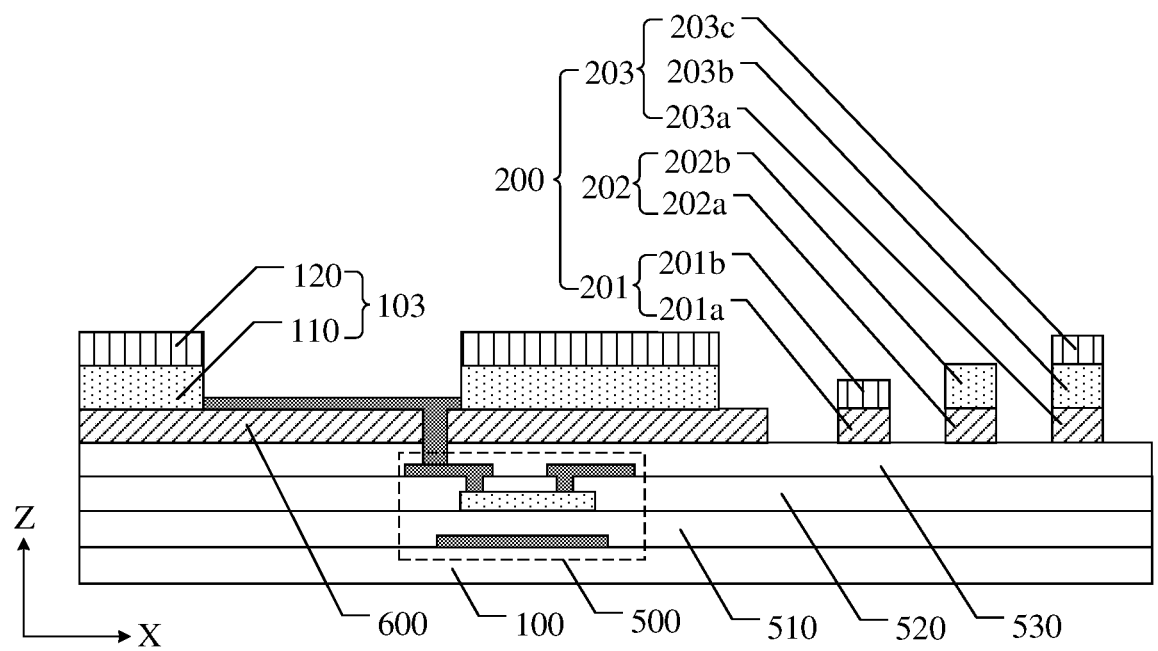

As shown in FIGS. 9B to 9C, a second defining layer 120 is formed on the base substrate 100, a patterning process is performed on the second defining layer 120, a plurality of openings are formed in the second defining layer 120 in the display area 101, and a portion of the second defining layer 120 in the non-display area 102 is formed as a second portion 201b of the first barrier dam and a third portion 203c of the third barrier dam. In this way, the first barrier dam 201, the second barrier dam 202 and the third barrier dam 203 may be obtained, and the first defining layer 110 and the second defining layer 120 may form a pixel defining layer 103.

It should be noted that the material for forming the first barrier dam 201, the second barrier dam 202 and the third barrier dam 203 may be lyophobic with respect to the first encapsulating material; alternatively, the first barrier dam 201, the second barrier dam 202, and the third barrier dam 203 are modified with a halogen element so that the first barrier dam 201, the second barrier dam 202 and the third barrier dam 203 are lyophobic with respect to the first encapsulating material.

Figure 9D:
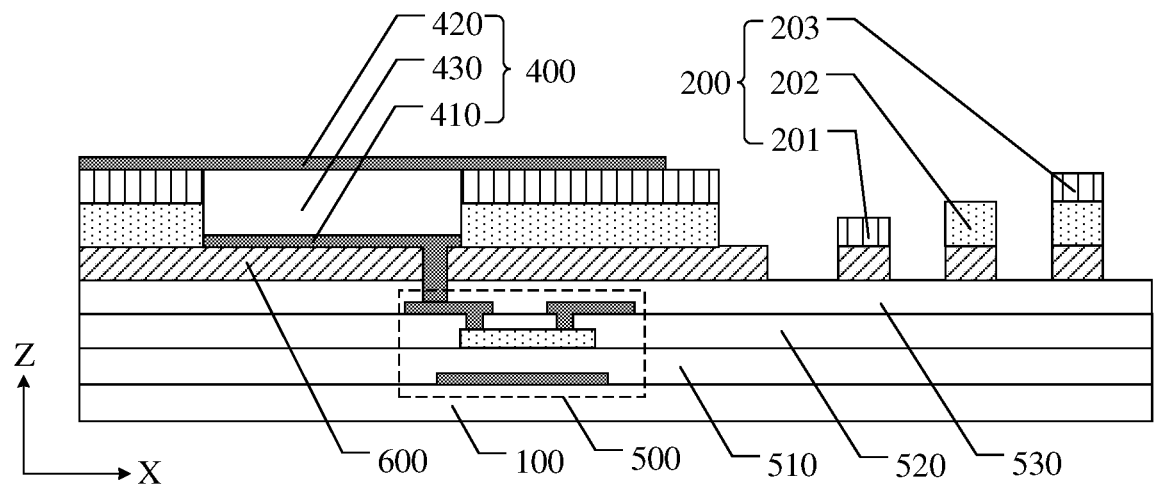

As shown in FIGS. 9C to 9D, an organic light emitting functional layer 430 is formed in the openings of the pixel defining layer 103, and then a second electrode layer 420 is formed on the organic light emitting functional layer 430. The first electrode layer 410, the organic light emitting functional layer 430 and the second electrode layer 420 are formed as an organic light emitting device 400.

Figure 9E:
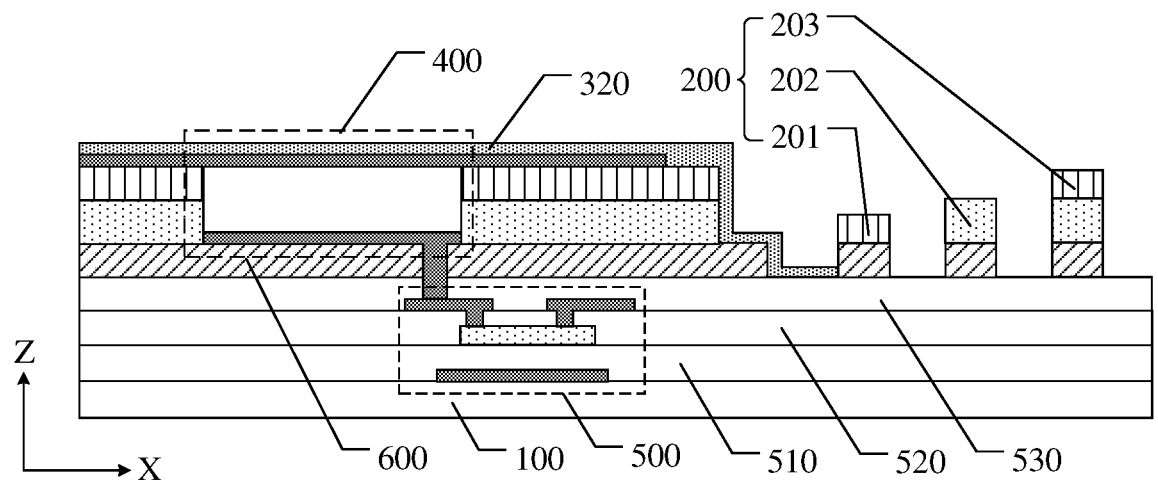

As shown in FIGS. 9D to 9E, an inorganic material film is deposited on the organic light emitting device 400 to form a second encapsulating layer 320, and the second encapsulating layer 320 is formed on a side of the first barrier dam 201 facing the display area.

Figure 9F:
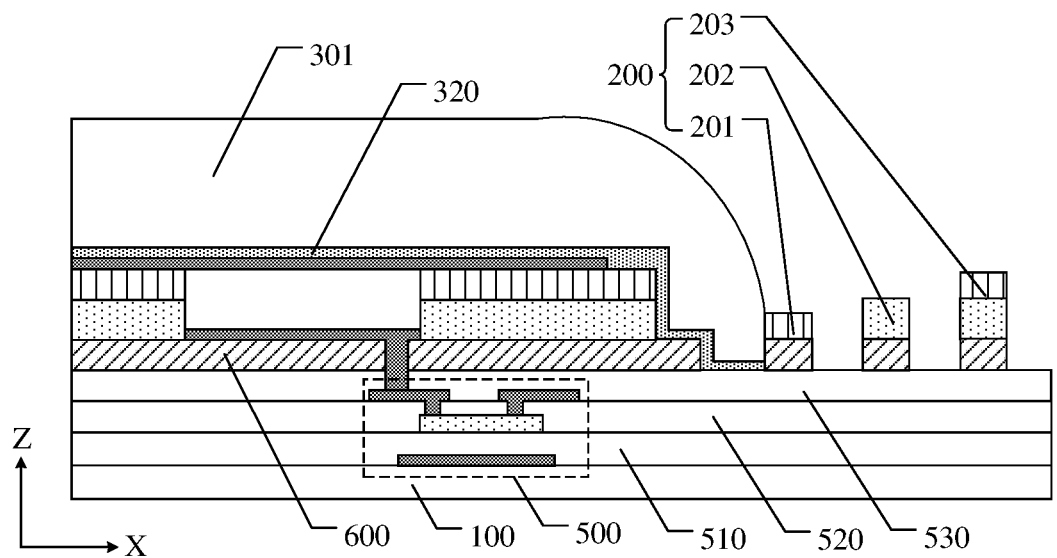

As shown in FIGS. 9E to 9F, a first encapsulating material 301 including an organic material is applied on the second encapsulating layer 320, a height of the first encapsulating material 301 is greater than a height of the first barrier dam 201, and the first barrier dam 201 blocks the first encapsulating material 301 so that the first encapsulating material 301 cannot extend to the second barrier dam 202. The first encapsulating material 301 is applied, for example, using an inkjet printing method. The first encapsulating material 301 may also be applied, for example, by spin coating or the like.

Figure 9G:
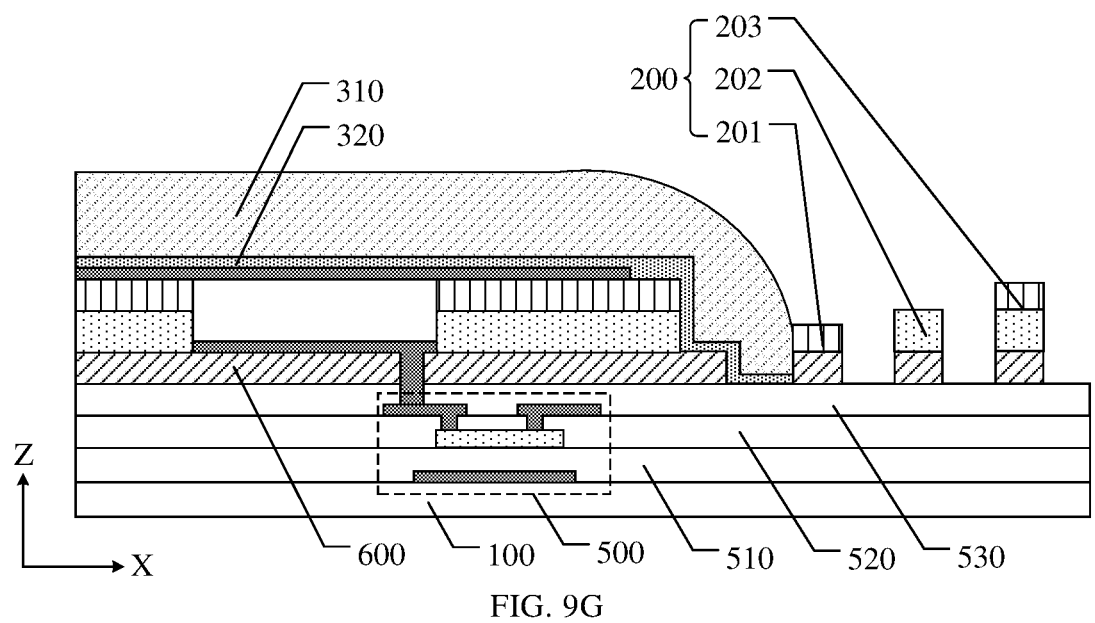

As shown in FIGS. 9F to 9G, the first encapsulating material 301 is dried so that the first encapsulating material 301 is formed into the first encapsulating layer 310. The first encapsulating layer 310 is formed on a side of the first barrier dam 201 facing the display area, and a height of the first encapsulating layer 310 is greater than a height of the first barrier dam 201.

As shown in FIGS. 9G and 7, an inorganic material film is deposited on the first encapsulating layer 310 to form a third encapsulating layer 330. The third encapsulating layer 330 covers the first encapsulating layer 310, and the third encapsulating layer 330 covers the first barrier dam 201, the second barrier dam 202, and the third barrier dam 203.

At least one embodiment of the present disclosure provides a display substrate, a method for fabricating the same, and a display panel, and may have at least one of the following advantages.

(1) In the display substrate in at least one embodiment of the present disclosure, the barrier dam can prevent overflow of the first encapsulating material for forming the first encapsulating layer, thereby increasing flatness and thickness of the first encapsulating layer, and improving encapsulation effect of the display substrate.

(2) In the display substrate in at least one embodiment of the present disclosure, at least part of the barrier dam may be in the same layer and made of the same material as the pixel defining layer, and thus, there is no need to increase the fabricating process of the display substrate, and the cost is reduced.

(3) In the display substrate in at least one embodiment of the present disclosure, part of the barrier dam may be a photoresist layer, which increases the height of the barrier dam, without increasing the fabricating process of the display substrate.

For the present disclosure, there are also the following points to be explained.

(1) The drawings of the embodiments of the present disclosure only relate to the structures related to the embodiments of the present disclosure, and other structures may refer to the common design.

(2) For clarity, the thickness of a layer or region in the drawings used to describe the embodiments of the present disclosure is exaggerated or reduced, i.e., the drawings are not drawn to scale.

(3) Without conflict, the embodiments of the present disclosure and features of the embodiments may be combined with each other to arrive at new embodiments.

The above only describe specific embodiments of the present disclosure, but the scope of the present disclosure is not limited thereto, and the scope of the present disclosure should be determined by the scope of the claims.

The invention claimed is:

1. A display substrate comprising a display area and a non-display area around the display area, the display substrate further comprising:
a base substrate;
a barrier dam on the base substrate in the non-display area; and
a first encapsulating layer on the base substrate and on a side of the barrier dam facing the display area;
wherein the first encapsulating layer is formed by a first encapsulating material in a cured state, and at least a side of the barrier dam facing the first encapsulating layer is lyophobic with respect to the first encapsulating material in a non-cured state,
the display substrate further comprises a pixel defining layer between the base substrate and the first encapsulating layer, the first pixel defining layer comprises a first pixel defining layer and a second pixel defining layer, the barrier dam comprises a first barrier layer, a second barrier layer, a first photoresist layer between the first barrier layer and the second barrier layer and a second photoresist layer on a side of the second barrier layer away from the first barrier layer, the first barrier layer is between the base substrate and the first photoresist layer, the first barrier layer and the first pixel defining layer are in a same layer and made of a same material, and the second barrier layer and the second pixel defining layer are in a same layer and made of a same material.

2. The display substrate of claim 1, wherein a planar shape of the barrier dam is a closed loop surrounding the display area.

3. The display substrate of claim 1, wherein the display substrate comprises a plurality of barrier dams, and the plurality of barrier dams are spaced apart from each other.

4. The display substrate of claim 3, wherein
the plurality of barrier dams comprise a first barrier dam and a second barrier dam, the first barrier dam is between the second barrier dam and the display area, and
a distance from a surface of the first barrier dam away from the base substrate to a surface of the base substrate facing the plurality of barrier dams is smaller than a distance from a surface of the second barrier dam away from the base substrate to the surface of the base substrate facing the plurality of barrier dams.

5. The display substrate of claim 4, wherein
the plurality of barrier dams further comprise a third barrier dam on a side of the second barrier dam away from the first barrier dam, and
the distance from the surface of the second barrier dam away from the base substrate to the surface of the base substrate facing the plurality of barrier dams is smaller than a distance from a surface of the third barrier dam away from the base substrate to the surface of the base substrate facing the plurality of barrier dams.

6. The display substrate of claim 1, wherein a distance from a surface of the first encapsulating layer away from the base substrate to a surface of the base substrate facing the first encapsulating layer is greater than a distance from a surface of the barrier dam away from the base substrate to the surface of the base substrate facing the first encapsulating layer.

7. The display substrate of claim 1, wherein
a material of the pixel defining layer comprises at least one of polymethyl methacrylate, polyimide, and acrylic.

8. The display substrate of claim 1, further comprising:
a second encapsulating layer between the first encapsulating layer and the base substrate; and
a third encapsulating layer on a side of the first encapsulating layer away from the base substrate;
wherein the first encapsulating layer is an organic layer, and the second encapsulating layer and the third encapsulating layer are inorganic layers.

9. The display substrate of claim 8, wherein
an orthographic projection of the barrier dam on the base substrate is outside orthographic projections of the first encapsulating layer and the second encapsulating layer on the base substrate; and
the orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate.

10. The display substrate of claim 8, wherein
an orthographic projection of at least one barrier dam on the base substrate is within orthographic projections of the first encapsulating layer and the second encapsulating layer on the base substrate, and an orthographic projection of at least one barrier dam on the base substrate is outside the orthographic projections of the first encapsulating layer and the second encapsulating layer on the base substrate; and
the orthographic projection of the first encapsulating layer on the base substrate is within an orthographic projection of the third encapsulating layer on the base substrate, and the orthographic projection of the barrier dam on the base substrate is within the orthographic projection of the third encapsulating layer on the base substrate.

11. The display substrate of claim 1, further comprising a plurality of organic light emitting devices,
wherein the plurality of organic light emitting devices are in the display area and between the first encapsulating layer and the base substrate.

12. The display substrate of claim 11, further comprising a planarization layer, wherein the planarization layer is between the organic light emitting device and the base substrate, and the barrier dam is at least partially in the same layer and made of the same material as the planarization layer.

13. A display panel comprising a display substrate, the display substrate being the display substrate of claim 1.

14. A method for fabricating a display substrate, comprising:
providing a base substrate, and defining, on the base substrate, a display area and a non-display area around the display area of the display substrate to be formed;
forming a barrier dam on the base substrate in the non-display area;
applying a first encapsulating material on the base substrate in the display area; and
curing the first encapsulating material to form a first encapsulating layer;
wherein at least a side of the barrier dam facing the first encapsulating layer is lyophobic with respect to the first encapsulating material before curing, and
the method further comprises forming a pixel defining layer between the base substrate the first encapsulating layer, wherein the pixel defining layer comprises a first pixel defining layer and a second pixel defining layer, the barrier dam comprises a first barrier layer, a second barrier layer, a first photoresist layer between the first barrier layer and the second barrier layer and a second photoresist layer on a side of the second barrier layer away from the first barrier layer, the first barrier layer is between the base substrate and the first photoresist layer, the first barrier layer and the first pixel defining layer are in a same layer and made of a same material, and the second barrier layer and the second pixel defining layer are in a same layer and made of a same material.

15. The method of claim 14, wherein
after forming the barrier dam and before applying the first encapsulating material on the base substrate, a modification process is performed on the barrier dam with a halogen element and/or an inert gas.

* * * * *